US008231959B2

(12) United States Patent
Ooe et al.

(10) Patent No.: US 8,231,959 B2
(45) Date of Patent: Jul. 31, 2012

(54) PHOTOSENSITIVE POLYMER COMPOSITION, METHOD OF PRODUCING PATTERN AND ELECTRONIC PARTS

(75) Inventors: Masayuki Ooe, Ibaraki (JP); Hiroshi Komatsu, Ibaraki (JP); Yoshiko Tsumaru, Ibaraki (JP); Dai Kawasaki, Ibaraki (JP); Kouji Katou, Ibaraki (JP); Takumi Ueno, Ibaraki (JP)

(73) Assignee: Hitachi Chemical Dupont Microsystems Ltd., Tokyo (JP)

( * ) Notice: Subject to any disclaimer, the term of this patent is extended or adjusted under 35 U.S.C. 154(b) by 524 days.

(21) Appl. No.: 10/585,738

(22) PCT Filed: Dec. 16, 2004

(86) PCT No.: PCT/JP2004/018832
§ 371 (c)(1), (2), (4) Date: Jul. 12, 2006

(87) PCT Pub. No.: WO2005/069075
PCT Pub. Date: Jul. 28, 2005

(65) Prior Publication Data
US 2008/0220222 A1    Sep. 11, 2008

(30) Foreign Application Priority Data
Jan. 14, 2004  (JP) ................. 2004-006715

(51) Int. Cl.
*B32B 3/00* (2006.01)
*G03F 7/00* (2006.01)

(52) U.S. Cl. .................. 428/195.1; 430/270.1; 430/311; 430/330

(58) Field of Classification Search ............... 428/195.1; 430/283.1, 270.1, 311, 330
See application file for complete search history.

(56) References Cited

U.S. PATENT DOCUMENTS
3,957,512 A    5/1976  Kleeberg et al.
(Continued)

FOREIGN PATENT DOCUMENTS
EP    1331517    7/2003
(Continued)

OTHER PUBLICATIONS
Machine translation of Detailed Description of JP2001-312063 A. Imported as Jp2001_312063detail.pdf.*
Machine translation of the Claims of JP2001-312063 A. Imported as Jp2001_312063clm.pdf.*
Machine translation of Detailed Description of JP2002-169283 A. Imported as Jp2002_169283detail.pdf.*
(Continued)

*Primary Examiner* — Gerard Higgins
(74) *Attorney, Agent, or Firm* — Antonelli, Terry, Stout & Kraus, LLP.

(57) ABSTRACT
A photosensitive polymer composition includes (a) a polyamide having a repeating unit represented by the following general formula (I):

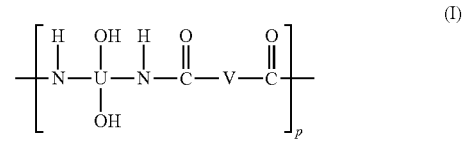

wherein U represents a tetravalent organic group, V represents a bivalent organic group and p is an integer representing a number of the repeating unit; (b) a compound which generates an acid upon receiving light; and (c) a compound represented by the following general formula (II):

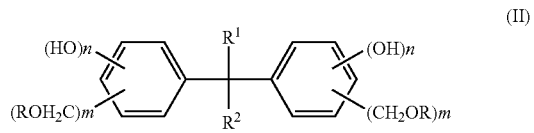

wherein m and n are each independently integer of 1 or 2, Rs are each independently hydrogen, alkyl group or acyl group, and $R^1$ and $R^2$ each independently represents fluoroalkyl group having 1 to 3 carbon atoms.

12 Claims, 1 Drawing Sheet

U.S. PATENT DOCUMENTS

2003/0194631 A1    10/2003    Suwa et al.
2003/0204117 A1*   10/2003    Matsuishi et al. ............ 568/718

FOREIGN PATENT DOCUMENTS

| | | |
|---|---|---|
| EP | 1352888 | 10/2003 |
| EP | 1365289 | 11/2003 |
| EP | 1 376 231 | 1/2004 |
| JP | 55-30207 | 8/1980 |
| JP | 57-170929 | 10/1982 |
| JP | 60-037550 | 2/1985 |
| JP | 64-006947 | 1/1989 |
| JP | 04-204945 | 7/1992 |
| JP | 09-302221 | 11/1997 |
| JP | 2000-305268 | 11/2000 |
| JP | 2001-042527 | 2/2001 |
| JP | 2001125267 A * | 5/2001 |
| JP | 2001-312063 | 11/2001 |
| JP | 2002088066 A * | 3/2002 |
| JP | 2002169283 A * | 6/2002 |
| JP | 2002-202593 | 7/2002 |
| JP | 2002-328472 | 11/2002 |
| JP | 2003-300923 | 10/2003 |

OTHER PUBLICATIONS

STN search of first iteration of component (c). Imported as STN1.pdf.*
STN search of second iteration of component (c). Imported as STN2.pdf.*
STN search of third iteration of component (c). Imported as STN3.pdf.*
STN search of fourth iteration of component (c). Imported as STN4.pdf.*
Certified translation of JP 2001-312063 A. Performed on Apr. 23, 2009. Imported as JP2001312063TRANS.PDF.*
Machine translation of detailed description of JP 2000-305268 A made on Jul. 20, 2009. Imported as JP2000_305268detail.pdf.*
Machine translation of claims of JP 2000-305268 A made on Jul. 20, 2009. Imported as JP2000_305268clm.pdf.*
Chinese Official Action issued Apr. 3, 2009, for Application No. 200480040128.5.
EP Search Report of Appln. 04807191.4 dated Jan. 3, 2011 in English.

* cited by examiner

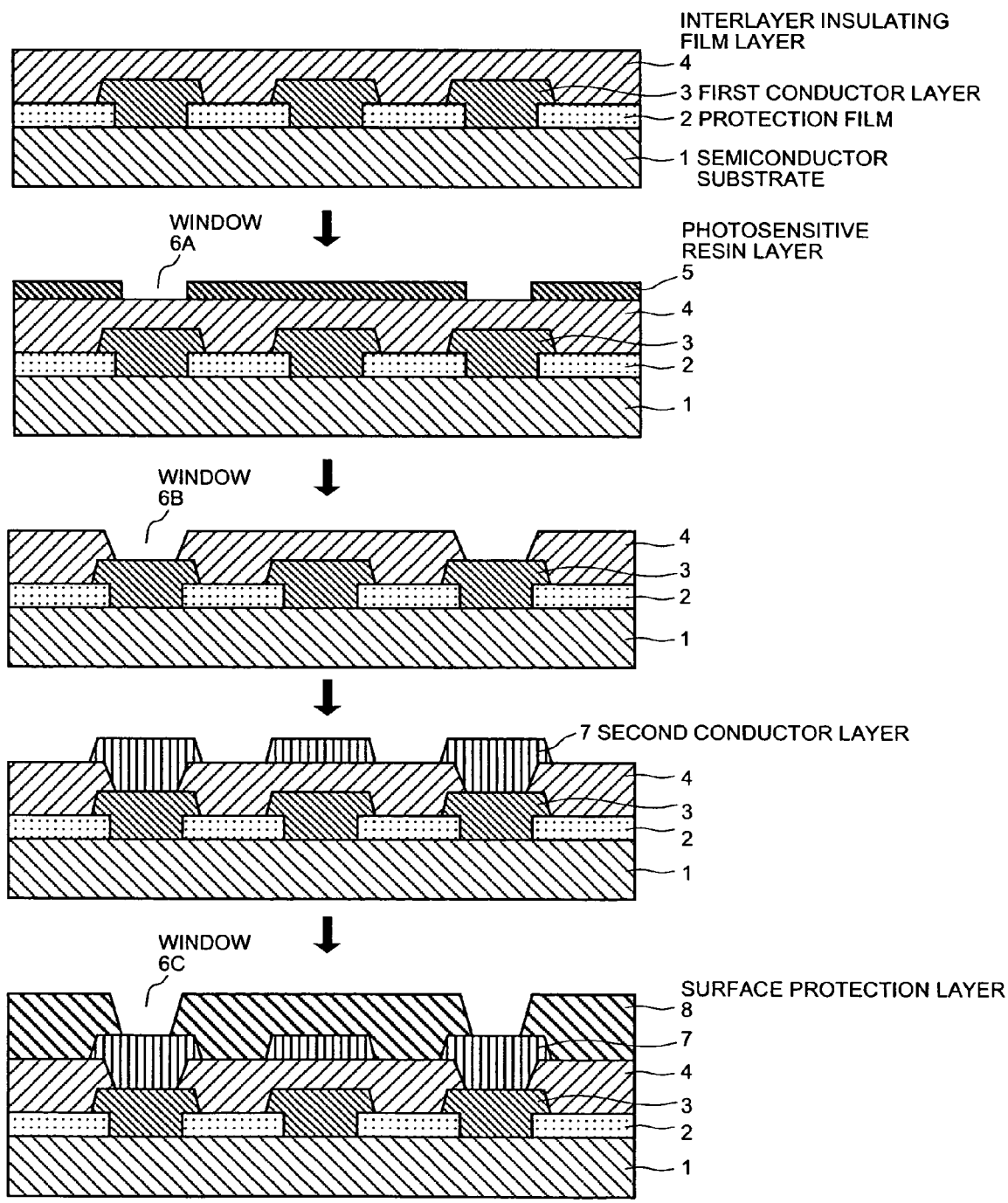

PHOTOSENSITIVE POLYMER COMPOSITION, METHOD OF PRODUCING PATTERN AND ELECTRONIC PARTS

TECHNICAL FIELD

The present invention relates to a photosensitive polymer composition, a method of producing a pattern and electronic parts using this composition. More particularly, the present invention relates to a positive type heat resistant photosensitive polymer composition which becomes a polybenzoxazole heat resistant polymer by heat treating and which is utilizable as a surface protection film and an interlayer insulating film in electronic parts such as semiconductor devices, and a method of producing a pattern, and electronic parts using this composition.

BACKGROUND ART

Conventionally, polyimide has been widely used as surface protection films or interlayer insulating films because of its advantages in resistance to heat, mechanical property and electric property, as well as easy film formability and planarizability of film surface.

When polyimide is used as the surface protection film or the interlayer insulating film, a forming process of through holes is performed by an etching process usually with the use of positive type photoresists. However, this forming process includes application and removal of the photoresists, and is therefore complicated. Thus, heat resistant materials having photosensitivity have been investigated for the purpose of streamlining works in this forming process.

Concerning photosensitive polyimide compositions, a polyimide precursor composition in which a photosensitive group has been introduced by an ester bond (this composition is referred to hereinbelow as the composition (1). See, e.g., Patent Document 1), and a composition of a polyamide acid added thereto a compound having a carbon-carbon double bond which is dimerizable or polymerizable upon receiving a chemical ray and an amino group and a compound containing an aromatic bisazide (this composition is referred to hereinbelow as composition (2). See, e.g., Patent Document 2) have been known and used.

When the photosensitive polyimide composition is used, typically a pattern is formed by applying the composition in a form of solution onto a substrate and then drying it, irradiating active light through a mask, and removing an exposed portion by a developing solution.

The aforementioned compositions (1) and (2) are negative type compositions which require an organic solvent as the developing solution. The developing solution composed of the organic solvent gives a heavy adverse impact on environment when discarded as liquid waste. Thus, in the light of recent environmental concern, now there is a demand for photosensitive heat resistant materials capable of being developed by an aqueous developing solution which is easily wasted. Further, in order to switch from the etching process using the positive type photoresist to the negative type photosensitive polyimide, it is necessary to change the mask in an exposure apparatus and the development equipment. The compositions (1) and (2) have the aforementioned problems.

Meanwhile, as the positive type photosensitive polyimide, a polyimide precursor in which an o-nitrobenzyl group is introduced by an ester bond (this composition is referred to hereinbelow as precursor composition (3). See, e.g., Patent Document 3), and a composition comprising phenolic hydroxyl group-containing polyamide acid ester and an o-diazoquinone compound (this composition is referred to hereinbelow as composition (4). See, e.g., Patent Document 4) have been known. As a positive type heat resistant material, a composition comprising a photosensitizer material using polybenzoxazole having heat resistance, mechanical property and electric property equivalent to those in polyimide, a polybenzoxazole precursor and an o-diazoquinone compound (this composition is referred to hereinbelow as composition (5). See, e.g., Patent Documents 5 and 6) has been known.

However, the precursor composition (3) has low sensitivity because its sensitive wavelength is mainly 300 nm or less. In particular, it is difficult to use the composition (3) with i-line stepper (single wavelength light at 365 nm) which is recently used. The compositions (4) and (5) have more sensitive than the precursor composition (3), but their sensitivity is insufficient for practical use. On the contrary, there is known a composition in which phenol binuclear compound is added aiming at enhancing the sensitivity (the composition is referred to hereinbelow as composition (6). See, e.g., Patent Document 6). However, when the phenol binuclear compound is added as in this composition (6), the pattern is easily deformed by melting of the phenol compound in a thermal cure process after the development, which results in a problem such as a degradation of resolution. Thus, it is difficult to provide the photosensitive polymer composition which has the sufficient sensitivity and which does not cause the pattern deformation in the thermal cure process after the development.

Patent Document 1: JP S55-30207
Patent Document 2: JP H03-36861 B
Patent Document 3: JP S60-37550 A
Patent Document 4: JP H04-204945 A
Patent Document 5: JP S64-6947 A
Patent Document 6: JP H09-302221 A

DISCLOSURE OF INVENTION

Problem to be Solved by the Invention

An object of the present invention is to solve at least aforementioned problems.

The present invention provides a favorable positive type photosensitive polymer composition which has high sensitivity, and which gives a pattern having a good form that does not deform in a step of curing.

The present invention also provides a method of producing a pattern having a high resolution and good shape by the use of the aforementioned photosensitive polymer composition.

The present invention further provides highly reliable electronic parts by having well-shaped precise patterns.

Means for Solving Problem

Namely, the present invention is as follows:

[1] A photosensitive polymer composition includes (a) a polyamide having a repeating unit represented by the following general formula (I):

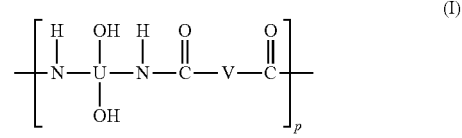

wherein U represents a tetravalent organic group, V represents a bivalent organic group and p is an integer representing a number of the repeating unit; (b) a compound which generates an acid upon receiving light; and (c) a compound represented by the following general formula (II):

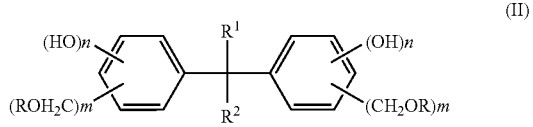

(II)

wherein m and n are each independently integer of 1 or 2, Rs are each independently hydrogen, alkyl group or acyl group, and $R^1$ and $R^2$ each independently represents fluoroalkyl group having 1 to 3 carbon atoms.

[2] polymer composition according to [1], wherein the compound represented by the general formula (II) is 2,2-bis[3,5-bis(hydroxymethyl)-4-hydroxyphenyl]-1,1,1,3,3,3-hexafluoropropane.

[3] The photosensitive polymer composition according to [1], wherein the compound represented by the general formula (II) is 2,2-bis[3,5-bis(methoxymethyl)-4-hydroxyphenyl]-1,1,1,3,3,3-hexafluoropropane.

[4] The photosensitive polymer composition according to any one of [1] to [3], wherein ratios of the component (b) and the component (c) are 5 to 100 parts by weight and 1 to 30 parts by weight, respectively based on 100 parts by weight of the component (a).

[5] The photosensitive polymer composition according to any one of [1] to [3] further comprising (d) a compound which reduces a solubility of the component (a) with respect to an alkali aqueous solution.

[6] The photosensitive polymer composition according to [5], wherein the component (d) is a diaryliodonium salt represented by the following general formula (III):

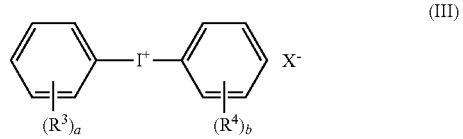

(III)

wherein $X^-$ represents counteranion, $R^3$ and $R^4$ each independently represents alkyl group or alkenyl group, and a and b are each independently integers of 0 to 5.

[7] The photosensitive polymer composition according to [5], wherein ratios of the component (b), the component (c) and the component (d) are 5 to 100 parts by weight, 1 to 30 parts by weight and 0.01 to 15 parts by weight, respectively based on 100 parts by weight of the component (a).

[8] A method of producing a pattern includes the steps of: applying the photosensitive polymer composition according to any one of [1] to [3] on a support substrate and drying the photosensitive polymer composition; exposing light to a photosensitive resin layer obtained by drying the photosensitive polymer composition to make a predetermined pattern; developing the photosensitive resin layer after the exposing light; and heat treating the photosensitive resin layer after the developing.

[9] The method of producing the pattern according to [8], wherein an exposure light source used in the step of exposing generates i-line.

[10] An electronic part includes an electronic device having a layer of the pattern obtained by the method according to [8], wherein the layer of the pattern is provided as an interlayer insulating film and/or a surface protection layer in the electronic device.

What has been described above, other objects, characteristics and advantages of the present invention will become apparent from the following detailed description of the invention.

Effect of the Invention

The photosensitive polymer composition of the present invention has high sensitivity and high resolution, and is excellent in pattern shape and film remaining ratio on an unexposed portion. Further, the pattern formed in accordance with the present invention is not deformed in the thermal curing process after the development, and is also excellent in resistance to heat.

According to the method of producing the pattern of the present invention, the pattern which exhibits the high resolution and has the good shape is obtained by the use of the above composition with high sensitivity.

The electronic part according to the present invention are highly reliable because of having the well-shaped pattern of polybenzoxazole as the surface protection film and/or the interlayer insulating film.

BRIEF DESCRIPTION OF DRAWINGS

FIG. 1 is a view showing a production process of a semiconductor apparatus having a multilayer wiring structure.

EXPLANATIONS OF LETTERS OR NUMERALS

1 semiconductor substrate
2 protection film
3 first conductor layer
4 interlayer insulating film layer
5 photosensitive resin layer
6A, 6B, and 6C window
7 second conductor layer
8 surface protection layer

BEST MODE FOR CARRYING OUT THE INVENTION

The component (a) having a repeating unit represented by the above general formula (I) in the present invention may generally be a phenolic hydroxyl group-containing polyamide which is soluble in an alkaline aqueous solution. The alkaline aqueous solution referred to herein is an alkaline solution such as an aqueous solution of tetramethyl ammonium hydroxide, an aqueous solution of metal hydroxide and an aqueous solution of organic amine. The amide unit containing the hydroxy groups represented by the general formula (I) can be subjected to a ring-closing dehydration upon curing and eventually converted into oxazole having an excellent resistance to heat, mechanical property and electrical property.

The polyamide having the repeating unit represented by the general formula (I) used in the present invention may include the aforementioned repeating unit. However, it is preferable that the polyamide includes the amide unit containing the hydroxy group at a predetermined ratio or more because the solubility of polyamide to the alkaline aqueous solution is attributed to the phenolic hydroxyl group.

That is, it is preferable that the polyamide has the repeating unit represented by the following general formula (IV):

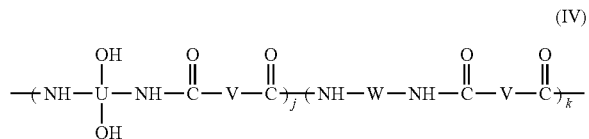

(IV)

wherein, U represents a tetravalent organic group; V and W represent bivalent organic groups; W is the bivalent organic group different from —U(OH)$_2$; j and k represent molar fractions; a sum of j and k is 100 mol %; and j is 60 to 100 mol % and k is 40 to 0 mol %. Here, in the molar fractions j and k in the formula, it is more preferable that j is 80 to 100 mol % and k is 20 to 0 mol %. The order of these repeating units may be random or regular.

The molecular weight of the component (a) is preferably 3,000 to 200,000 and more preferably 5,000 to 100,000 in terms of the weight average molecular weight. The molecular weight referred to herein is a value measured by a gel permeation chromatography method and obtained by converting the measured result using a calibration curve of standard polystyrene.

In the present invention, the polyamide having the repeating unit represented by the general formula (I) may be generally synthesized from a dicarboxylate derivative and diamines containing the hydroxy group. Specifically, the polyamide may be synthesized by converting the dicarboxylate derivative into a dihalide derivative, and then reacting the dihalide derivative with the diamines containing the hydroxy group. A dichloride derivative is preferable as the dihalide derivative.

The dichloride derivative may be synthesized by the reaction of a halogenating agent with the dicarboxylate derivative. As the halogenating agent, thionyl chloride, phosphoryl chloride, phosphorus oxychloride and phosphorus pentachloride used for a usual chlorination reaction of carboxylic acid may be used.

Examples of the method of synthesizing the dichloride derivative may include a method of reacting the dicarboxylate derivative with the above halogenating agent in a solvent; and a method of reacting in the excessive halogenating agent followed by distilling off the excessive agent. As the reaction solvent, N-methyl-2-pyrrolidone, N-methyl-2-pyridone, N,N-dimethylacetamide, N,N-dimethylformamide, toluene and benzene may be used.

In the aforementioned method of reaction in the solvent, the amount of the halogenating agent to be used is preferably 1.5 to 3.0 mol, and more preferably 2.0 to 2.5 mole based on 1 mol of the dicarboxylate derivative. In the method of reaction in the halogenating agent, its amount is preferably 4.0 to 50 mol and more preferably 5.0 to 20 mol. The reaction temperature is preferably −10 to 70° C. and more preferably 0 to 20° C.

It is preferable to react the dichloride derivative with diamines in the organic solvent in the presence or absence of a dehydrohalogenating agent. As the dehydrohalogenating agent, typically an organic base such as pyridine and triethylamine is used. As the organic solvent, for example, N-methyl-2-pyrrolidone, N-methyl-2-pyridone, N,N-dimethylacetamide, and N,N-dimethylformamide may be used. The reaction temperature is preferably −10 to 30° C. and more preferably 0 to 20° C.

The tetravalent organic group represented by U in the general formula (I) is a residue of a diamine which forms a polyamide structure by reacting with the dicarboxylate derivative. The diamine may have a structure in which two hydroxy groups are located at ortho-positions of each amine. Among such diamine residues, a tetravalent aromatic group is preferable. The diamine residue may preferably have 6 to 40 carbon atoms, and may more preferably be a tetravalent aromatic group having 6 to 40 carbon atoms. The tetravalent aromatic group may still more preferably have all of four binding sites on the aromatic ring.

Examples of such diamines may include 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane and 2,2-bis(4-amino-3-hydroxyphenyl)-1,1,1,3,3,3-hexafluoropropane. These compounds may be used alone or in combination of two or more.

In polyamide represented by the above general formula (IV), the bivalent organic group represented by W is generally a diamine residue which forms a polyamide structure by reacting with dicarboxylic acid. This diamine residue is the residue having the different structure from that of diamine which forms the above —U(OH)$_2$—, and a bivalent aromatic or aliphatic group is preferable. The diamine residue having 4 to 40 carbon atoms is preferable, and the bivalent aromatic group having 4 to 40 carbon atoms is more preferable.

Examples of such diamines may include aromatic diamine compounds such as 4,4'-diaminodiphenyl ether, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis[4-(4-aminophenoxy)phenyl]ether and 1,4-bis(4-aminophenoxy)benzene, and additionally LP-7100, X-22-161AS, X-22-161A, X22-161B, X-22-161C and X-22-161E (brand names supplied from Shin-Etsu Chemical Co., Ltd.) as diamines containing a silicone group. These compounds may be used alone or in combination of two or more.

The bivalent organic group represented by V in the general formula (I) is a residue of dicarboxylic acid which forms the polyamide structure by reacting with diamine. Among such residues of dicarboxylic acid, a bivalent aromatic group is preferable. The residue of carboxylic acid having 6 to 40 carbon atoms is preferable, and the bivalent aromatic group having 6 to 40 carbon atoms is more preferable. As the bivalent aromatic group, it is preferable that all of two binding sites are present on the aromatic ring.

Examples of such dicarboxylic acids may include aromatic dicarboxylic acids such as isophthalic acid, terephthalic acid, 2,2-bis(4-carboxyphenyl)-1,1,1,3,3,3-hexafluoropropane, 4,4'-dicarboxybiphenyl, 4,4'-dicarboxydiphenyl ether, 4,4'-dicarboxytetraphenylsilane, bis(4-carboxyphenyl)sulfone, 2,2-bis(p-carboxyphenyl)propane, 5-tert-butyl isophthalate, 5-bromoisophthalic acid, 5-fluoroisophthalic acid, 5-chloroisophthalic acid and 2,6-naphthalene dicarboxylate, and aliphatic dicarboxylic acids such as 1,2-cyclobutanedicarboxylic acid, 1,4-cyclohexanedicarboxylic acid, 1,3-cyclopentanedicarboxylic acid, oxalic acid, malonic acid and succinic acid. These compounds may be used alone or in combination of two or more.

The compound which is the component (b) used in the present invention and generates an acid upon receiving light is a photosensitizer and has a function of generating an acid by light irradiation to increase the solubility of an irradiated portion to the alkaline aqueous solution. Types of the compound may include o-quinonediazide compounds, aryldiazonium salts, diaryliodonium salts and triarylsulfonium salts, are not particularly limited, and the o-quinonediazide compound is preferable in terms of sensitivity. This o-quinonediazide compound is obtained by condensing o-quinonediazide sulfonyl chloride with a hydroxy compound or an amino compound in the presence of a dehydrochloric acid agent.

Examples of the above o-quinonediazide sulfonyl chlorides may include 1,2-benzoquinone-2-diazide-4-sulfonyl chloride, 1,2-naphthoquinone-2-diazide-5-sulfonyl chloride, and 1,2-naphthoquinone-2-diazide-4-sulfonyl chloride.

Examples of the above hydroxy compound may include hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane and tris(4-hydroxyphenyl)ethane.

Examples of the above amino compounds may include p-phenylenediamine, m-phenylenediamine, 4,4'-diaminodiphenyl ether, 4,4'-diaminodiphenylmethane, 4,4'-diaminodiphenylsulfone, 4,4'-diaminodiphenylsulfide, o-aminophenol, m-aminophenol, p-aminophenol, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, bis(3-amino-4-hydroxyphenyl)hexafluoropropane, and bis(4-amino-3-hydroxyphenyl)hexafluoropropane.

It is preferable to combine o-quinonediazide sulfonyl chloride at an equivalent ratio of 0.5 to 1 based on the hydroxy compound and the amino compound. A preferable ratio of the dehydrochloric acid agent to o-quinonediazide sulfonyl chloride is in the range of 0.95/1 to 1/0.95. A preferable reaction temperature is 0 to 40° C., and a preferable reaction time period is 1 to 10 hours.

As a reaction solvent, the solvent such as dioxane, acetone, methyl ethyl ketone, tetrahydrofuran, diethyl ether and N-methyl pyrrolidone are used.

The dehydrochloric acid agent may include sodium carbonate, sodium hydroxide, sodium hydrogen carbonate, potassium carbonate, potassium hydroxide, trimethylamine, triethylamine and pyridine.

In the photosensitive polymer composition of the present invention, the amount of the component (b) to be combined is preferably 5 to 100 parts by weight and more preferably 8 to 40 parts by weight based on 100 parts by weight of the component (a) in terms of dissolving speed difference between an exposed portion and an unexposed portion and acceptable range of the sensitivity.

The component (c) used for the present invention is a particular compound having two or more phenolic hydroxyl groups and two or more hydroxymethyl groups, alkoxymethyl groups or acyloxymethl groups as well as having fluoroalkyl group in the molecule. The use of the component (c) increases a dissolving speed of the exposed portion to enhance the sensitivity when developed in the alkali aqueous solution. It is also possible to prevent the pattern from being deformed when cured after forming the pattern. Among hydroxymethyl group, alkoxymethyl group or acyloxymethl group, in particular, hydroxymethyl group, methoxymethyl group and ethoxymethyl group are preferable.

The component (c) represented by the above general formula (II) may include 2,2-bis[3,5-bis(hydroxymethyl)-4-hydroxyphenyl]-1,1,1,3,3,3-hexafluoropropane, 2,2-bis[3,5-bis(methoxymethyl)-4-hydroxyphenyl])-1,1,1,3,3,3-hexafluoropropane, 2,2-bis[3,5-bis(ethoxymethyl)-4-hydroxyphenyl]-1,1,1,3,3,3-hexafluoropropane, 2,2-bis[3,5-bis(propoxymethyl)-4-hydroxyphenyl]-1,1,1,3,3,3-hexafluoropropane, 2,2-bis[3,5-bis(acetoxymethyl)-4-hydroxyphenyl]-1,1,1,3,3,3-hexafluoropropane, 3,3-bis[3,5-bis(hydroxymethyl)-4-hydroxyphenyl]perfluoropentane, and 3,3-bis[3,5-bis(methoxymethyl)-4-hydroxyphenyl]perfluoropentane.

Among them, 2,2-bis[3,5-bis(hydroxymethyl)-4-hydroxyphenyl]-1,1,1,3,3,3-hexafluoropropane, and 2,2-bis[3,5-bis(methoxymethyl)-4-hydroxyphenyl]-1,1,1,3,3,3-hexafluoropropane are the most preferable in terms of a sensitivity enhancing effect and a solubility of the film after prebaking.

In the photosensitive polymer composition according to the present invention, the amount of the component (c) to be combined is preferably 1 to 30 parts by weight and more preferably 5 to 20 parts by weight based on 100 parts by weight of the component (a) in terms of development time and acceptable range of the film remaining ratio in the unexposed portion.

In the present invention, the component (d) used as needed is a compound which reduces the solubility of the component (a) to the alkali aqueous solution, is not particularly limited as long as it has such a property, and is preferably a diaryliodonium salt represented by the following general formula (III):

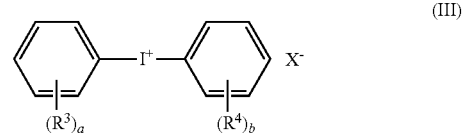

wherein $X^-$ represents counteranion, $R^3$ and $R^4$ each independently represents alkyl group or alkenyl group, and a and b are each independently integers of 0 to 5. This is because, the diaryliodonium salt has a highly advantageous effect to reduce the solubility of the above component (a).

Examples of the anion represented by $X^-$ may include nitrate ion, tetrafluoroboron ion, perchlorate ion, trifluoromethanesulfonate ion, p-toluene sulfonate ion, thiocyanate ion, chlorine ion, bromine ion and iodine ion.

Examples of the diaryliodonium salt represented by the general formula (III) may include diphenyliodonium nitrate, bis(p-tert-butylphenyl)iodonium nitrate, diphenyliodonium trifluoromethanesulfonate, bis(p-tert-butylphenyl)iodonium trifluoromethanesulfonate, diphenyliodonium bromide, diphenyliodonium chloride and diphenyliodonium iodide.

Among them, diphenyliodonium nitrate, diphenyliodonium trifluoromethanesulfonate and diphenyliodonium-8-anilinonaphthalene-1-sulfonate are preferable in terms of high effectiveness.

The amount of the component (d) to be combined is preferably 0.01 to 15 parts by weight, more preferably 0.01 to 10 parts by weight, still more preferably 0.05 to 7 parts by weight and especially preferably 0.1 to 5 parts by weight based on 100 parts by weight of the component (a) in terms of sensitivity and acceptable range of the development time.

The photosensitive polymer composition according to the present invention may be obtained by dissolving the components (a), (b) and (c), and if necessary the component (d) in the solvent.

As the solvent, aprotic polar solvents such as N-methyl-2-pyrrolidone, N,N-dimethylformamide, N,N-dimethylacetamide, dimethylsulfoxide, hexamethylphosphorylamide, tetramethylenesulfone and γ-butylolactone are preferable, and these may be used alone or in combination of two or more.

It is also possible to combine the solvent such as diethyl ketone, diisobutyl ketone, methyl amyl ketone, ethyl lactate and propylene glycol monomethyl ether acetate for enhancing a coating property.

The amount of the solvent is not particularly limited, however the solvent is generally prepared so that the amount of the solvent is 20 to 90% by weight in the composition.

The photosensitive polymer composition according to the present invention may include, for example, an organic silane compound or an aluminium chelate compound as an adhesive auxiliary agent if necessary.

Examples of the organic silane compound may include γ-aminopropyltrimethoxysilane, γ-aminopropyltriethoxysilane, vinyltriethoxysilane, γ-glycidoxypropyltrimethoxysilane, γ-methacryloxypropyltrimethoxysilane, γ-mercaptopropyltrimethoxysilane and urea propyltriethoxysilane.

Examples of the aluminium chelate compound may include tris(acetylacetonate)aluminium and acetyl acetate aluminium diisopropylate.

The photosensitive polymer composition according to the present invention may be made into a pattern of polyoxazole through the method of producing the pattern described later.

The method of producing the pattern according to the present invention is characterized by comprising the steps of: applying the photosensitive polymer composition onto a support substrate and drying the composition; exposing light to a photosensitive resin layer obtained by the drying to make a predetermined pattern; developing the photosensitive resin layer after the exposure; and heat treating the photosensitive resin layer after the development.

In the step of applying onto the support substrate and drying, the photosensitive polymer composition is applied by rotational application using a spinner onto the support substrate such as glass substrate, semiconductor, metal oxide insulator (e.g., $TiO_2$, $SiO_2$) and silicon nitride, and subsequently dried using a hot plate or an oven.

Then, in the exposure step, active light beam such as ultraviolet ray, visible light ray or radiation ray is exposed through a mask onto the photosensitive polymer composition which has turned to a film layer on the support substrate.

In the development step, a relief pattern is obtained by removing the exposed portion with a developing solution. Examples of the developing solution may preferably include alkaline aqueous solutions such as aqueous solutions of sodium hydroxide, potassium hydroxide, sodium silicate, ammonia, ethylamine, diethylamine, triethylamine, triethanol amine and tetramethyl ammonium hydroxide. It is preferable that a base concentration in these aqueous solutions is 0.1 to 10% by weight. Alcohols and surfactants may be further added to the above developing solution to use. These may be each combined in the range of preferably 0.01 to 10 parts by weight and more preferably 0.1 to 5 parts by weight based on 100 parts by weight of the developing solution.

Then, in the step of heat treatment, the obtained pattern is heat treated preferably at 150 to 450° C., thereby obtaining the pattern of heat resistant polybenzoxazole having an oxazole ring or the other functional group.

The photosensitive polymer composition according to the present invention may be used for electronic parts in the semiconductor apparatus and the multilayer wiring plate, and specifically may be used for forming surface protection films and interlayer insulating films in the semiconductor apparatus and the interlayer insulating films in the multilayer wiring plate.

The semiconductor apparatus according to the present invention is not particularly limited, and may have various structures except for having the surface protection film and the interlayer insulating film formed using the above composition.

The electronic parts according to the present invention are electronic parts providing an electronic device having the pattern layer obtained by the above production method, and is characterized in that the above pattern layer is provided as the interlayer insulating film and/or the surface protection film in the above electronic device.

One example of a process for producing the semiconductor apparatus using the present invention will be described below.

FIG. 1 is a view showing a production process of the semiconductor apparatus in a multilayer wiring structure. From the top to the bottom, a series of steps of a first step to a fifth step is shown. In FIG. 1, a semiconductor substrate 1 such as Si substrate having a circuit device is covered with a protection film 2 such as silicon oxide film except for a predetermined portion of the circuit device, and a first conductor layer 3 is formed on the exposed circuit device. A coating layer of a polyimide resin is formed as an interlayer insulating film layer 4 on the semiconductor substrate by a spin coating method (first step).

Subsequently, a chlorinated rubber based or phenol novolak based photosensitive resin layer 5 is formed on the interlayer insulating film layer 4 by the spin coating method, and a window 6A is provided by a publicly known photograph etching technology so that a predetermined portion of the interlayer insulating film layer 4 is exposed (second step).

The interlayer insulating film layer 4 at the window 6A is selectively etched by a dry etching procedure using gas of oxygen or carbon tetrafluoride to provide a window 6B. Then, the photosensitive resin layer 5 is completely removed using an etching solution which corrodes only the photosensitive resin layer 5 without corroding the first conductor layer 3 exposed from the window 6B (third step).

A second conductor layer 7 is further formed using the publicly known photograph etching technology to electrically connect with the first conductor layer 3 completely (fourth step).

When the multilayer wiring structure having three or more layers is formed, each layer may be formed by repeating the above steps.

Subsequently, a surface protection layer is formed. In the example in FIG. 1, the above photosensitive polymer composition is applied by the spin coating method and dried, then the light is irradiated from above a mask where a pattern to form a window 6C at a predetermined portion has been depicted, subsequently the layer is developed by an alkaline aqueous solution to form a relief pattern, and heated to form the surface protection layer 8 (polybenzoxazole film) (fifth step). This surface protection layer 8 (polybenzoxazole film) protects the conductor layer from stress and α-ray from the outside, and the obtained semiconductor apparatus is excellent in reliability.

In the above example, it is also possible to form the interlayer insulating film layer 4 using the photosensitive polymer composition according to the present invention.

EXAMPLES

The present invention will be described below based on Examples. The Examples described below are only exemplifications for suitably illustrating the present invention and do not limit the present invention.

Synthetic Example 1

Into a 0.5 liter flask equipped with a stirrer and a thermometer, 23.2 g (0.10 mol) of 4,4'-dicarboxydiphenyl ether and 130 g of N-methyl-2-pyrrolidone (NMP) were added, and stirred to dissolve. Subsequently, the flask was cooled to 0° C., 22.5 g (0.189 mol) of thionyl chloride was dripped with keeping a reaction temperature at 10° C. or below, and the mixture after dripping was stirred at around 10° C. for 30 minutes to yield a solution of 4,4'-dicarboxydiphenyl ether dichloride ($\alpha$).

Then, 155 g of NMP was placed in a 0.5 liter flask equipped with a stirrer and a thermometer, 36.6 g (0.10 mol) of 2,2-bis(3-amino-4-hydroxyphenyl)-1,1,1,3,3,3-hexafluoropropane was added thereto, and stirred to dissolve. Subsequently, 29.9 g (0.378 mol) of pyridine was added. This solution was cooled, the solution of 4,4'-dicarboxydiphenyl ether dichloride ($\alpha$) was dripped over 30 minutes with keeping the temperature at 0 to 10° C., and subsequently the solution was stirred at around room temperature for 30 minutes. To this solution, 2.1 g (0.02 mol) of cyclopropylcarbonyl chloride was dripped over 5 minutes at room temperature, and the solution was further stirred at around room temperature for 30 minutes.

The reaction solution obtained in this way was poured in 4 liters of water, and a precipitate was collected and washed, and then dried under reduced pressure at 50° C. for 24 hours to yield 55 g of polyhydroxyamide (P-1). A weight average molecular weight of the obtained polymer was 25,200, and a ratio of the cyclopropylcarbonyl group at a polymer end calculated from $^1$H-NMR spectrum was 86%.

Synthetic Example 2

Into a 0.5 liter flask equipped with a stirrer and a thermometer, 20.7 g (0.09 mol) of 4,4'-dicarboxydiphenyl ether and 117 g of N-methyl-2-pyrrolidone (NMP) were added, and stirred to dissolve. Subsequently, the flask was cooled to 0° C., 20.0 g (0.168 mol) of thionyl chloride was dripped with keeping the reaction temperature at 10° C. or below, and the mixture after dripping was stirred at around 10° C. for 30 minutes to yield a solution of 4,4'-dicarboxydiphenyl ether dichloride ($\beta$).

Then, 154 g of NMP was placed in a 0.5 liter flask equipped with a stirrer and a thermometer, 35.2 g (0.096 mol) of 2,2-bis(3-amino-4-hydroxyphenyl)-1,1,1,3,3,3-hexafluoropropane was added thereto, and stirred to dissolve. Subsequently, 26.6 g (0.336 mol) of pyridine was added. This solution was cooled, the solution of 4,4'-dicarboxydiphenyl ether dichloride ($\beta$) was dripped over 30 minutes with keeping the temperature at 0 to 10° C., and subsequently the solution was stirred at around room temperature for 30 minutes. To this solution, 3.3 g (0.032 mol) of cyclopropylcarbonyl chloride was dripped over 5 minutes at room temperature, and the solution was further stirred at around room temperature for 30 minutes.

The reaction solution obtained in this way was poured in 4 liters of water, and a precipitate was collected and washed, and then dried under reduced pressure at 50° C. for 24 hours to yield 55 g of polyhydroxyamide (P-2). The weight average molecular weight of the obtained polymer was 17,300, and the ratio of the amino group to the cyclopropylcarbonyl group at the polymer end calculated from $^1$H-NMR spectrum was 91%.

Synthetic Example 3

Into a 0.5 liter flask equipped with a stirrer and a thermometer, 24.8 g (0.096 mol) of 4,4'-dicarboxydiphenyl ether and 140 g of N-methyl-2-pyrrolidone (NMP) were added, and stirred to dissolve. Subsequently, the flask was cooled to 0° C., 24.0 g (0.202 mol) of thionyl chloride was dripped with keeping the reaction temperature at 10° C. or below, and the mixture after dripping was stirred at around 10° C. for 30 minutes to yield a solution of 4,4'-dicarboxydiphenyl ether dichloride ($\gamma$).

Then, 130 g of NMP was placed in a 0.5 liter flask equipped with a stirrer and a thermometer, 29.3 g (0.080 mol) of 2,2-bis(3-amino-4-hydroxyphenyl)-1,1,1,3,3,3-hexafluoropropane and 3.5 g (0.032 mol) of m-aminophenol were added thereto, and stirred to dissolve. Subsequently, 31.9 g (0.403 mol) of pyridine was added. This solution was cooled, the solution of 4,4'-dicarboxydiphenyl ether dichloride ($\gamma$) was dripped over 30 minutes with keeping the temperature at 0 to 10° C., and subsequently the solution was stirred at around room temperature for 30 minutes.

The reaction solution obtained in this way was poured in 4 liters of water, and a precipitate was collected and washed, and then dried under reduced pressure at 50° C. for 24 hours to yield 52 g of polyhydroxyamide (P-3). The weight average molecular weight of the obtained polymer was 16,700. No peak of an aromatic moiety derived from an amino group end could be identified from $^1$H-NMR spectrum. Therefore, it was speculated that the polymer in which m-aminophenol had been almost quantitatively substituted at the polymer end was generated.

Synthetic Example 4

Into a 0.3 liter flask equipped a the stirrer and a thermometer, 10 g (0.034 mol) of tris(4-hydroxyphenyl)methane, 26.7 g (0.099 mol) of 1,2-naphthoquinone-2-diazide-4-sulfonyl chloride and 135 g of dioxane were added, and stirred to dissolve. The flask was cooled, and a mixture of 10.2 g (0.101 mol) of triethylamine and 10.2 g of dioxane was dripped with keeping the temperature at 20° C. or below. After dripping, a reaction solution was stirred at room temperature for one hour. The reaction solution was poured into 1 liter of an aqueous solution of 0.1% hydrochloric acid. Then, a precipitate was collected and washed, and dried under reduced pressure at 40° C. for 24 hours to yield 30 g of naphthoquinonediazidesulfonyl ester (A). The obtained naphthoquinonediazidesulfonyl ester (A) was analyzed by HPLC, and consequently the ratio of contained triester was 91.8%.

Example 1

20.0 g of polyhydroxyamide (P-1) obtained in Synthetic Example 1, 3.0 g of naphthoquinonediazidesulfonyl ester (A) obtained in Synthetic Example 4, 1.0 g of 2,2-bis[3,5-bis(hydroxymethyl)-4-hydroxyphenyl]-1,1,1,3,3,3-hexafluoropropane and 0.6 g of γ-mercaptopropyltrimethoxysilane were stirred and dissolved in 32 g of γ-butylolactone. This solution was filtrated with pressure using Teflon (registered trademark) filter having a pore size of 3 μm to yield a photosensitive polymer composition.

The obtained photosensitive polymer composition was applied on the rotating silicon wafer by a spinner, and heated and dried on a hot plate at 120° C. for 3 minutes to obtain a coating film of 12.0 μm. An exposure treatment was given to this coating film via a reticle by using an i-line stepper (supplied from Canon Inc.) as an exposure apparatus and changing exposure amounts in the range of 100 to 810 mJ/cm$^2$ with an increment of 10 mJ/cm$^2$. Then, a paddle development for 90 seconds was performed using an aqueous solution of 2.38% by weight of tetramethyl ammonium hydroxide as a developing solution, and the coating film was washed with purified water to obtain patterns. The proper exposure amount was determined to be 280 mJ/cm$^2$ by observing the obtained patterns. It was confirmed that the pattern having a good shape down to a dimension of 3 μm was formed by this exposure amount. A film remaining ratio in an unexposed portion was 81%. The obtained pattern was heated at 350° C. under a nitrogen atmosphere for one hour, consequently, the pattern of a polybenzoxazole film having the good shape was obtained, and no deformation of the pattern owing to the cure was observed.

Example 2

A photosensitive polymer composition was obtained by the same way as in Example 1, except that 2,2-bis[3,5-bis(methoxymethyl)-4-hydroxyphenyl]-1,1,1,3,3,3-hexafluoropropane was used in place of 2,2-bis[3,5-bis(hydroxymethyl)-4-hydroxyphenyl]-1,1,1,3,3,3-hexafluoropropane used in Example 1.

The obtained photosensitive polymer composition was applied on the rotating silicon wafer by the spinner, and heated and dried on the hot plate at 120° C. for 3 minutes to obtain a coating film of 11.7 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 110 seconds was performed using the aqueous solution of 2.38% by weight of tetramethyl ammonium hydroxide as a developing solution, and the coating film was washed with purified water to obtain patterns. The proper exposure amount was determined to be 280 mJ/cm$^2$ by observing the obtained patterns. It was confirmed that the pattern having the good shape down to the dimension of 3 μm was formed by this exposure amount. The film remaining ratio in the unexposed portion was 80%. The obtained pattern was heated at 350° C. under the nitrogen atmosphere for one hour, consequently, the pattern of the polybenzoxazole film having the good shape was obtained, and no deformation of the pattern owing to the cure was observed.

Example 3

20.0 g of polyhydroxyamide (P-2) obtained in Synthetic Example 2, 2.0 g of naphthoquinonediazidesulfonyl ester (A) obtained in Synthetic Example 4, 2.0 g of 2,2-bis[3,5-bis(hydroxymethyl)-4-hydroxyphenyl]-1,1,1,3,3,3-hexafluoropropane, 0.36 g of diphenyliodonium nitrate and 0.6 g of γ-mercaptopropyltrimethoxysilane were stirred and dissolved in 30 g of γ-butylolactone. This solution was filtrated with pressure using Teflon (registered trademark) filter having the pore size of 3 μm to yield a photosensitive polymer composition.

The obtained photosensitive polymer composition was applied on the rotating silicon wafer by the spinner, and heated and dried on the hot plate at 120° C. for 3 minutes to obtain a coating film of 11.9 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 90 seconds was performed using the aqueous solution of 2.38% by weight of tetramethyl ammonium hydroxide as a developing solution, and the coating film was washed with purified water to obtain patterns. The proper exposure amount was determined to be 260 mJ/cm$^2$ by observing the obtained patterns. It was confirmed that the pattern having the good shape down to the dimension of 3 μm was formed by this exposure amount. The film remaining ratio in the unexposed portion was 80%. The obtained pattern was heated at 350° C. under the nitrogen atmosphere for one hour, consequently, the pattern of the polybenzoxazole film having the good shape was obtained, and no deformation of the pattern owing to the cure was observed.

Example 4

20.0 g of polyhydroxyamide (P-3) obtained in Synthetic Example 3, 2.0 g of naphthoquinonediazidesulfonyl ester (A) obtained in Synthetic Example 4, 2.0 g of 2,2-bis[3,5-bis(hydroxymethyl)-4-hydroxyphenyl]-1,1,1,3,3,3-hexafluoropropane, 0.6 g of γ-mercaptopropyltrimethoxysilane and 0.46 g of diphenyliodonium nitrate were stirred and dissolved in 30 g of γ-butylolactone. This solution was filtrated with pressure using Teflon (registered trademark) filter having the pore size of 3 μm to yield a photosensitive polymer composition.

The obtained photosensitive polymer composition was applied on the rotating silicon wafer by the spinner, and heated and dried on the hot plate at 120° C. for 3 minutes to obtain a coating film of 12.1 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 100 seconds was performed using the aqueous solution of 2.38% by weight of tetramethyl ammonium hydroxide as a developing solution, and the coating film was washed with purified water to obtain patterns. The proper exposure amount was determined to be 230 mJ/cm$^2$ by observing the obtained patterns. It was confirmed that the pattern having the good shape down to the dimension of 3 μm was formed by this exposure amount. The film remaining ratio in the unexposed portion was 79%. The obtained pattern was heated at 350° C. under the nitrogen atmosphere for one hour, consequently, the pattern of the polybenzoxazole film having the good shape was obtained, and no deformation of the pattern owing to the cure was observed.

Comparative Example 1

A photosensitive polymer composition was obtained by the same constitution, combined amounts and procedures as in Example 1, except that 2,2-bis[3,5-bis(hydroxymethyl)-4-hydroxyphenyl]-1,1,1,3,3,3-hexafluoropropane was removed.

The obtained photosensitive polymer composition was applied on the rotating silicon wafer by the spinner, and heated and dried on the hot plate at 120° C. for 3 minutes to obtain a coating film of 11.9 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 130 seconds was performed using the aqueous solution of 2.38% by weight of tetramethyl ammonium hydroxide as a developing solution, and the coating film was washed with purified water to obtain patterns. The proper exposure amount was determined to be 350 mJ/cm$^2$ by observing the obtained patterns. It was confirmed that the pattern having the good shape down to the dimension of 3 μm was formed by this exposure amount. The film remaining ratio in the unexposed portion was 79%. The obtained pattern was heated at 350° C. under the nitrogen atmosphere for one hour, consequently, the deformation of the pattern was observed using a metallographic microscope, and the pattern of 7 μm or less (square pattern) which had opened was occluded.

Comparative Example 2

A photosensitive polymer composition was obtained by the same constitution, combined amounts and procedures as in Example 3, except that 2,2-bis[3,5-bis(hydroxymethyl)-4-hydroxyphenyl]-1,1,1,3,3,3-hexafluoropropane was removed and the amount of diphenyliodonium nitrate was changed to 0.1 g.

The obtained photosensitive polymer composition was applied on the rotating silicon wafer by the spinner, and heated and dried on the hot plate at 120° C. for 3 minutes to obtain a coating film of 12.0 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 90 seconds was performed using the aqueous solution of 2.38% by weight of tetramethyl ammonium hydroxide as a developing solution, and the coating film was washed with purified water to obtain patterns. The proper exposure amount was determined to be 330 mJ/cm$^2$ by observing the obtained patterns. It was confirmed that the pattern having the good shape down to the dimension of 3 μm was formed by this exposure amount. The film remaining ratio in the unexposed portion was 80%. The obtained pattern was heated at 350° C. under the nitrogen atmosphere for one hour, consequently, the deformation of the pattern was observed using a metallographic microscope, and the pattern of 8 μm or less (square pattern) which had opened was occluded.

Comparative Example 3

A photosensitive polymer composition was obtained by the same constitution, combined amounts and procedures as in Example 4, except that 2,2-bis[3,5-bis(hydroxymethyl)-4-hydroxyphenyl]-1,1,1,3,3,3-hexafluoropropane was removed and the amount of diphenyliodonium nitrate was changed to 0.16 g.

The obtained photosensitive polymer composition was applied on the rotating silicon wafer by the spinner, and heated and dried on the hot plate at 120° C. for 3 minutes to obtain a coating film of 11.9 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 100 seconds was performed using the aqueous solution of 2.38% by weight of tetramethyl ammonium hydroxide as a developing solution, and the coating film was washed with purified water to obtain patterns. The proper exposure amount was determined to be 320 mJ/cm$^2$ by observing the obtained patterns. It was confirmed that the pattern having the good shape down to the dimension of 3 μm was formed by this exposure amount. The film remaining ratio in the unexposed portion was 78%. The obtained pattern was heated at 350° C. under the nitrogen atmosphere for one hour, consequently, the deformation of the pattern was observed using a metallographic microscope, and the pattern of 8 μm or less (square pattern) which had opened was occluded.

Comparative Example 4

A photosensitive polymer composition was obtained by the same constitution, combined amounts and procedures as in Example 1, except that 2,2-bis[3,5-bis(hydroxymethyl)-4-hydroxyphenyl]propane was used in place of 2,2-bis[3,5-bis(hydroxymethyl)-4-hydroxyphenyl]-1,1,1,3,3,3-hexafluoropropane.

The obtained photosensitive polymer composition was applied on the rotating silicon wafer by the spinner, and heated and dried on the hot plate at 120° C. for 3 minutes to obtain a coating film of 11.8 μm. The exposure treatment was given to this coating film via the reticle by using the i-line stepper (supplied from Canon Inc.) as an exposure apparatus and changing the exposure amounts in the range of 100 to 810 mJ/cm$^2$ with an increment of 10 mJ/cm$^2$. Then, the paddle development for 80 seconds was performed using the aqueous solution of 2.38% by weight of tetramethyl ammonium hydroxide as a developing solution, and the coating film was washed with purified water to obtain patterns. The proper exposure amount was determined to be 320 mJ/cm$^2$ by observing the obtained patterns, and the sensitivity was not so high. It was confirmed that the pattern having the good shape down to the dimension of 3 μm was formed by this exposure amount. The film remaining ratio in the unexposed portion was 80%. The obtained pattern was heated at 350° C. under the nitrogen atmosphere for one hour, consequently, the pattern of the polybenzoxazole film having the good shape was obtained, and no deformation of the pattern owing to the cure was observed.

INDUSTRIAL APPLICABILITY

As mentioned above, the photosensitive polymer composition and the method of producing the pattern according to the present invention are suitable for forming the surface protection film and the interlayer insulating film in the electronic parts such as semiconductor devices. The electronic parts according to the present invention can provide highly reliable electronic equipments because of having the pattern having the good shape.

The invention claimed is:
1. A photosensitive polymer composition comprising:
(a) a polyamide having a repeating unit represented by the following general formula (I):

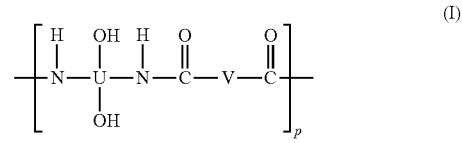

wherein U represents a tetravalent organic group, V represents a bivalent organic group and p is an integer representing a number of the repeating unit;

(b) a compound which generates an acid upon receiving light; and (c) 2,2-bis[3,5-bis(hydroxymethyl)-4-hydroxyphenyl]-1,1,3,3,3-hexafluoropropane or 2,2-bis[3,5-bis(methoxymethyl)-4-hydroxyphenyl]-1,1,1,3,3,3-hexafluoropropane.

2. The photosensitive polymer composition according to claim 1, wherein ratios of the component (b) and the component (c) are 5 to 100 parts by weight and 1 to 30 parts by weight, respectively based on 100 parts by weight of the component (a).

3. The photosensitive polymer composition according to claim 1, further comprising (d) a compound which reduces a solubility of the component (a) with respect to an alkali aqueous solution.

4. The photosensitive polymer composition according to claim 3, wherein the component (d) is a diaryliodonium salt represented by the following general formula (III):

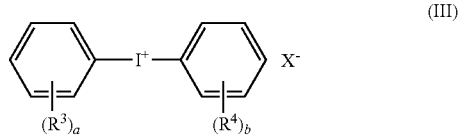

(III)

wherein X⁻ represents a counteranion, each of $R^3$ and $R^4$ independently represents an alkyl group or an alkenyl group, and each of a and b represents independently an integer of 0 to 5.

5. The photosensitive polymer composition according to claim 3, wherein ratios of the component (b), the component (c) and the component (d) are 5 to 100 parts by weight, 1 to 30 parts by weight and 0.01 to 15 parts by weight, respectively based on 100 parts by weight of the component (a).

6. The photosensitive polymer composition according to claim 1, wherein said compound represented by the general formula (II) is included in the photosensitive polymer composition in an amount of 1 to 30 parts by weight based on 100 parts by weight of said polyamide.

7. The photosensitive polymer composition according to claim 1, wherein said compound represented by the general formula (II) is included in the photosensitive polymer composition in an amount of 5 to 20 parts by weight based on 100 parts by weight of said polyamide.

8. A method of producing a pattern comprising the steps of:
applying the photosensitive polymer composition according to claim 1 on a support substrate and drying the photosensitive polymer composition;
exposing light to a photosensitive resin layer obtained by drying the photosensitive polymer composition to make a predetermined pattern;
developing the photosensitive resin layer after the exposing light; and
heat treating the photosensitive resin layer after the developing.

9. The method of producing the pattern according to claim 8, wherein an exposure light source used in the step of exposing generates i-line.

10. The method of producing the pattern according to claim 8, wherein said developing is performed by removing portions of the photosensitive resin layer exposed to the light with an alkaline aqueous solution.

11. The method of producing the pattern according to claim 8, wherein said heat treating is performed at a temperature in a range of 150° to 450° C.

12. An electronic part comprising:
an electronic device having a layer of the pattern obtained by the method according to claim 8,
wherein the layer of the pattern is provided as an interlayer insulating film and/or a surface protection layer in the electronic device.

* * * * *